US011137446B2

(12) United States Patent
Inage et al.

(10) Patent No.: US 11,137,446 B2
(45) Date of Patent: Oct. 5, 2021

(54) TEST APPARATUS AND TEST METHOD (71) Applicant: ADVANTEST CORPORATION, Tokyo (JP)

(72) Inventors: Shuichi Inage, Tokyo (JP); Kazuhiro Iezumi, Tokyo (JP); Tomoyuki Itakura, Tokyo (JP); Keisuke Kusunoki, Tokyo (JP); Yoshihiro Kato, Tokyo (JP); Kazuhiro Tsujikawa, Tokyo (JP); Naoya Kimura, Tokyo (JP); Yuki Watanabe, Tokyo (JP); Yuichiro Harada, Tokyo (JP); Koji Miyauchi, Tokyo (JP)

(73) Assignee: ADVANTEST CORPORATION, Tokyo (JP)

( * ) Notice: Subject to any disclaimer, the term of this patent is extended or adjusted under 35 U.S.C. 154(b) by 98 days.

(21) Appl. No.: 16/580,444

(22) Filed: Sep. 24, 2019

(65) Prior Publication Data
US 2020/0225286 A1 Jul. 16, 2020

(30) Foreign Application Priority Data

Jan. 15, 2019 (JP) .............................. JP2019-004261

(51) Int. Cl.
*G06F 11/00* (2006.01)
*G01R 31/317* (2006.01)
(Continued)

(52) U.S. Cl.
CPC . *G01R 31/31726* (2013.01); *G01R 31/31724* (2013.01); *G01R 31/318314* (2013.01); *G06F 11/2733* (2013.01)

(58) Field of Classification Search
CPC ........ G01R 31/31726; G01R 31/31724; G01R 31/318314; G01R 31/3183;
(Continued)

(56) References Cited

U.S. PATENT DOCUMENTS 6,055,658 A * 4/2000 Jaber ................ G01R 31/31903
714/726
2006/0248425 A1* 11/2006 Stimson ................ G06F 11/273
714/741
(Continued)

FOREIGN PATENT DOCUMENTS

JP 2005309543 A 11/2005
JP 2015082317 A 4/2015
KR 1020050041134 A 5/2005

OTHER PUBLICATIONS

KIPO Office Action corresponding to KR Application No. 10-2019-0117944, dated Aug. 7, 2020.
(Continued)

Primary Examiner — Christine T. Tu
(74) Attorney, Agent, or Firm — Cantor Colburn LLP (57) ABSTRACT A test apparatus is configured to test a DUT that does not support synchronous control from an external circuit. A main controller is configured based on an architecture that tests a device by synchronous control with the main controller itself as the master. A MIU is configured as an interface between the main controller and the DUT. The MIU establishes asynchronous control between it and the DUT with the DUT as the master, and establishes control between it and the main controller with the main controller as the master.

9 Claims, 6 Drawing Sheets (51) Int. Cl.
*G01R 31/3183* (2006.01)
*G06F 11/273* (2006.01)

(58) Field of Classification Search
CPC .... G01R 31/318307; G01R 31/318364; G01R 31/3025; G01R 31/31903; G01R 31/31905; G01R 31/31908; G01R 31/303; G06F 11/267; G06F 11/273; G06F 11/2733
See application file for complete search history.

(56) References Cited

U.S. PATENT DOCUMENTS

2009/0105970 A1* 4/2009 Kodera .......... G01R 31/318314
702/58
2010/0312517 A1* 12/2010 McNamara ...... G01R 31/31726
702/119

OTHER PUBLICATIONS

KRIPO Notice of Decision for Final Rejection corresponding to KR Application No. 10-2019-0117944, dated Feb. 15, 2021.

* cited by examiner

TEST APPARATUS AND TEST METHOD

CROSS REFERENCES TO RELATED APPLICATIONS

The present application claims priority under 35 U.S.C. § 119 to Japanese Patent Application 2019-004261, filed on Jan. 15, 2019, the entire contents of which being incorporated herein by reference.

BACKGROUND OF THE INVENTION

1. Field of the Invention

The present invention relates to a test apparatus.

2. Description of the Related Art

In order to test mass-produced semiconductor devices, a semiconductor test apparatus (Automatic Test Equipment: ATE, which will be simply referred to as a "test apparatus" hereafter) is employed. The test apparatus supplies a test signal to a device under test (DUT), acquires a response from the device under test according to the test signal, and judges whether or not the response thus acquired matches an expected value.

Conventionally, typical examples of such a DUT include memory that operates in a passive manner under external control. The test apparatus writes data (a test pattern) to the memory. Subsequently, the test apparatus reads the data from the memory, and judges whether or not the data thus read matches an expected value.

Figure 1:
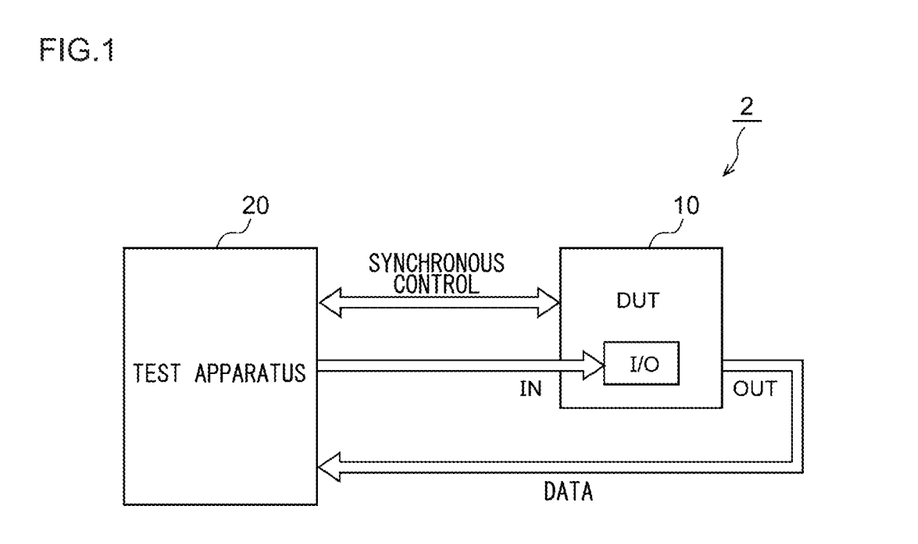
FIG. 1 is a diagram showing an architecture of a conventional test system.

FIG. 1 is a diagram showing an architecture of a conventional test system 2. A DUT 10 such as memory or the like has a function of receiving an input of data from a test apparatus 20 and outputting a signal based on the signal thus input (which is referred to as an "I/O (Input/Output) block"). Furthermore, the DUT 10 is capable of receiving the input of a synchronization signal (system clock signal), which allows the operation of the I/O block to be controlled in units of clock cycles. Accordingly, the test apparatus 20 is capable of acquiring the information with respect to the state of the DUT 10 and of controlling the DUT 10 in units of clock cycles. With the test system 2 according to such a conventional technique, the test apparatus 20 is operated as the master, and the DUT 10 is operated as the slave, and synchronous control is provided at the level of clock cycles.

Such a test apparatus 20 has been developed in order to meet the demand for testing a large amount of memory with high efficiency. Accordingly, such an existing test apparatus 20 is configured based on an architecture that supports synchronous control using the test apparatus 20 as the master.

In recent years, there has been an increased need for testing devices such as SoC (System on Chip), SiP (System in Package), etc., (which will also be referred to as "composite devices" hereafter) configured to autonomously operate in an active manner. Composite devices can be classified into several device groups, i.e., (i) devices each including a processor in a state in which an OS (Operating System) has been installed, each of which is nearly an end product, (ii) devices each including a built-in oscillator and configured to receive no external synchronous signal, etc.

The test apparatus is not capable of controlling the data input/output timing for such a composite device for every clock cycle. That is to say, this involves asynchronous control between the test apparatus and the composite device. Accordingly, in a case of applying such a conventional memory test architecture configured to support such synchronous control as it is, this leads to degradation of test efficiency, which drastically lowers the throughput.

SUMMARY OF THE INVENTION

The present invention has been made in view of such a situation. It is an exemplary purpose of an embodiment of the present invention to provide a test apparatus, a test method, and the like, that allow a device to be tested with high efficiency even if it is difficult to synchronously control the device at the level of external clock cycles.

An embodiment of the present invention relates to a test apparatus. The test apparatus is structured to test a device under test comprising a device-side communication circuit and a program-controllable device-side processor. The test apparatus comprises: a main controller structured to integrally control the test apparatus; and an interface unit comprising a program-controllable tester-side processor and a tester-side communication circuit structured to form a transmission channel between the interface unit and the device-side communication circuit. The device-side processor executes a device script so as to execute an asynchronous test with the device under test as a master.

Also, an arrangement may be made in which the device script can be loaded to the device under test from the test apparatus before a test.

Also, the device script may be loaded via a wired interface that differs from the interface between the device-side communication circuit and the tester-side communication circuit.

Also, the device-side communication circuit and the tester-side communication circuit may each conform to $I^2C$ (Inter IC) or SPI (Serial Peripheral Interface). Also, an arrangement may be made in which the master/slave relation can be switched between them.

Also, the interface unit may judge the quality of the device under test based on data received by the tester-side communication circuit via the transmission channel. Also, the judgment result may be provided to the main controller.

Also, the tester-side processor may execute a tester script that defines a test sequence together with the device script.

Another embodiment of the present invention also relates to a test apparatus. The test apparatus is structured to test a device under test that does not support external synchronous control. The test apparatus comprises: a main controller structured based on an architecture that tests the device under test by synchronous control with the main controller as a master; and an interface unit structured as an interface between the main controller and the device under test, and structured to establish asynchronous control between it and the device under test with the device under test as a master, and to establish control between it and the main controller with the main controller as a master.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is coupled to the member B" includes a state in which the member A is indirectly coupled to the member B via another member that does not substantially affect the electric connection between them, or that does not damage the functions or effects of the connection between them, in addition to a state in which they are physically and directly coupled.

Similarly, the state represented by the phrase "the member C is provided between the member A and the member B" includes a state in which the member A is indirectly coupled to the member C, or the member B is indirectly coupled to the member C via another member that does not substantially affect the electric connection between them, or that does not damage the functions or effects of the connection between them, in addition to a state in which they are directly coupled.

Figure 2:
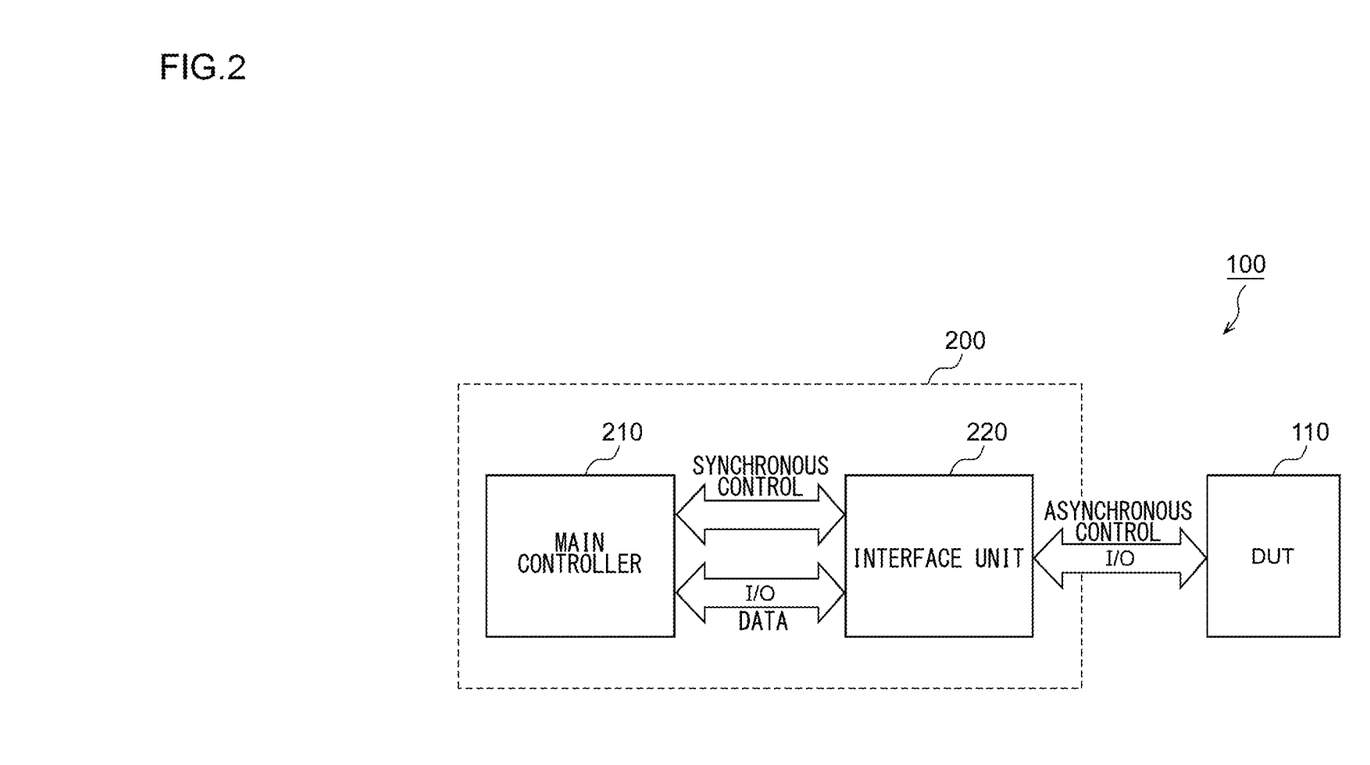
FIG. 2 is a block diagram showing a test system according to an embodiment.

FIG. 2 is a block diagram showing a test system 100 according to an embodiment. The test system 100 includes a DUT 110 and a test apparatus 200. The DUT 110 is a device such as a SiP, SoC, or the like, for which it is difficult to perform synchronous control of the DUT 110 itself from an external circuit.

The test apparatus 200 includes a main controller 210 and a multi-interface unit (which will be referred to as "MIU" hereafter) 220. The main controller 210 is configured as a core platform based on an architecture that supports synchronous control with the main controller 210 itself as the master so as to test a DUT.

The MIU 220 is arranged between the main controller 210 and the DUT 110. The MIU 220 functions as an interface between the main controller 210 and the DUT 110. The MIU 220 is configured to support asynchronous control between the MIU 220 and the DUT 110 with the DUT 110 as the master, and to support control between the main controller 210 and the MIU 220 with the main controller 210 as the master.

In an embodiment, the main controller 210 may be configured as an existing hardware component that is applicable to a memory test, i.e., ATE. The MIU 220 can be regarded as an additional hardware component arranged between the main controller (ATE) 210 and the DUT 110.

Figure 3:
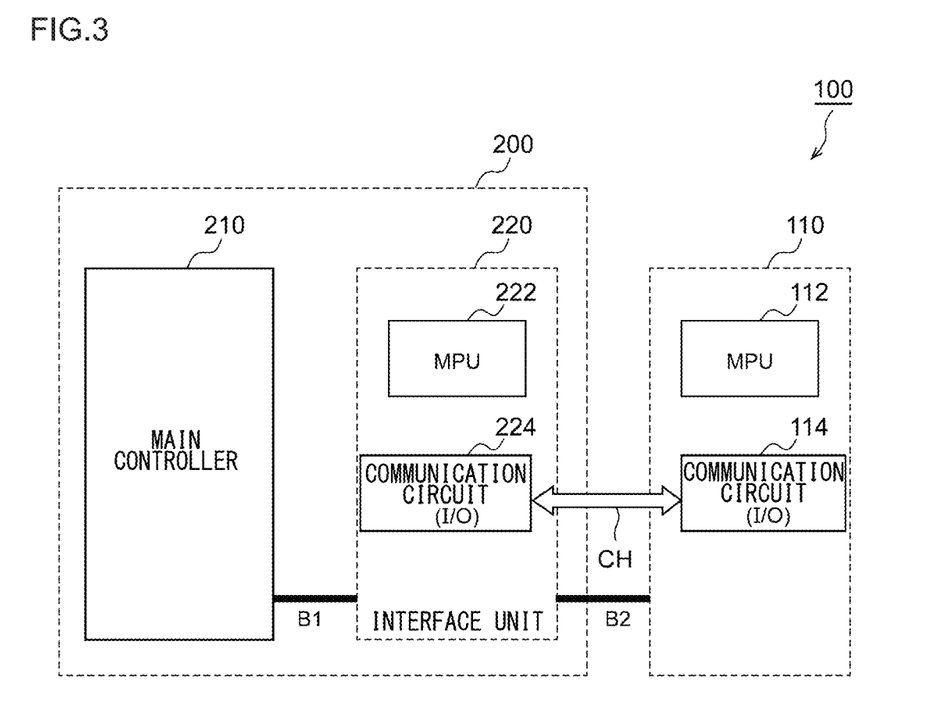
FIG. 3 is a block diagram showing a test system according to an embodiment.

FIG. 3 is a block diagram showing the test system 100 according to the embodiment. The DUT 110 includes a device-side processor 112 and a device-side communication circuit 114. The device-side processor 112 is configured as a program-controllable hardware component such as a MPU (Micro Processing Unit), CPU (Central Processing Unit), or the like. In many cases, an IoT (Internet of Things) device, which is an example of a composite device, mounts, as its processor, a processor core designed by the ARM Corporation. In addition to the device-side processor 112, the DUT 110 may include an oscillator and memory as its built-in components.

The device-side communication circuit 114 is configured as a wired or wireless interface that conforms to a predetermined communication protocol that allows data transmission and reception between it and an external circuit. For example, the device-side communication circuit 114 may be configured as a wired serial interface such as an I²C (Inter IC) interface, SPI (Serial Peripheral Interface), GPIO (General Purpose Input/Output), UART (Universal Asynchronous Receiver/Transmitter), or the like. Also, the device-side communication circuit 114 may be configured as a multi-media interface configured to transmit image data and audio data, such as HDMI (High-Definition Multimedia Interface) (trademark), MIPI (Mobile Industry Processor Interface), I²S (Inter-IC Sound), or the like. Also, the device-side communication circuit 114 may be configured as a wireless interface such as Bluetooth (trademark), WiFi (trademark), ZigBee (trademark), or the like.

The MIU 220 includes a tester-side processor 222 and a tester-side communication circuit 224. The tester-side processor 222 is configured as a program-controllable hardware component such as a CPU (Central Processing Unit), microprocessor, MPU (Micro Processing Unit), or the like.

The tester-side communication circuit 224 conforms to the same communication protocol as that employed in the device-side communication circuit 114. The tester-side communication circuit 224 provide a wired or wireless transmission channel CH between it and the device-side communication circuit 114.

The tester-side communication circuit 224 may be configured as a FPGA (Field Programmable Gate Array) or an ASIC (Application Specific Integrated Circuit). The tester-side communication circuit 224 absorbs the processing latency in the DUT 110. This allows the sequence control timing to be maintained between the main controller 210 and the MIU 220.

In the DUT 110, the device-side processor 112 executes a device script (which will be referred to as a "DUT script" hereafter) SCR1. The script is configured as code including multiple instructions, which is synonymous with a program. With this, in the MIU 220, the tester-side processor 222 executes a MIU script SCR_MIU which defines a test sequence together with the DUT script SCR_DUT. With this arrangement, a function test supported by the device-side communication circuit 114 is executed under asynchronous control with the DUT 110 as the master.

An arrangement may be made in which the DUT script SCR_DUT can be loaded from the main controller 210 to the DUT 110 before the test. In the same manner, an arrangement may be made in which the MIU script SCR_MIU can be loaded from the main controller 210 to the MIU 220.

The main controller 210 and the MIU 220 are connected by means of a bus B1. Furthermore, the MIU 220 and the DUT 110 are connected by means of a bus B2. The bus B1 and B2 may each be configured as a USB (Universal Serial Bus), Ethernet (trademark), or the like. The buses B1 and B2 are each configured as an interface that is independent of the transmission channel CH which is a function test target. The bus B1 is used for the main controller 210 to control the MIU 220. The bus B2 is used for the MIU 220 to control the DUT 110. Also, the buses B1 and B2 may be used to load the DUT script SCR_DUT and the MIU script SCR_MIU.

Figure 4:
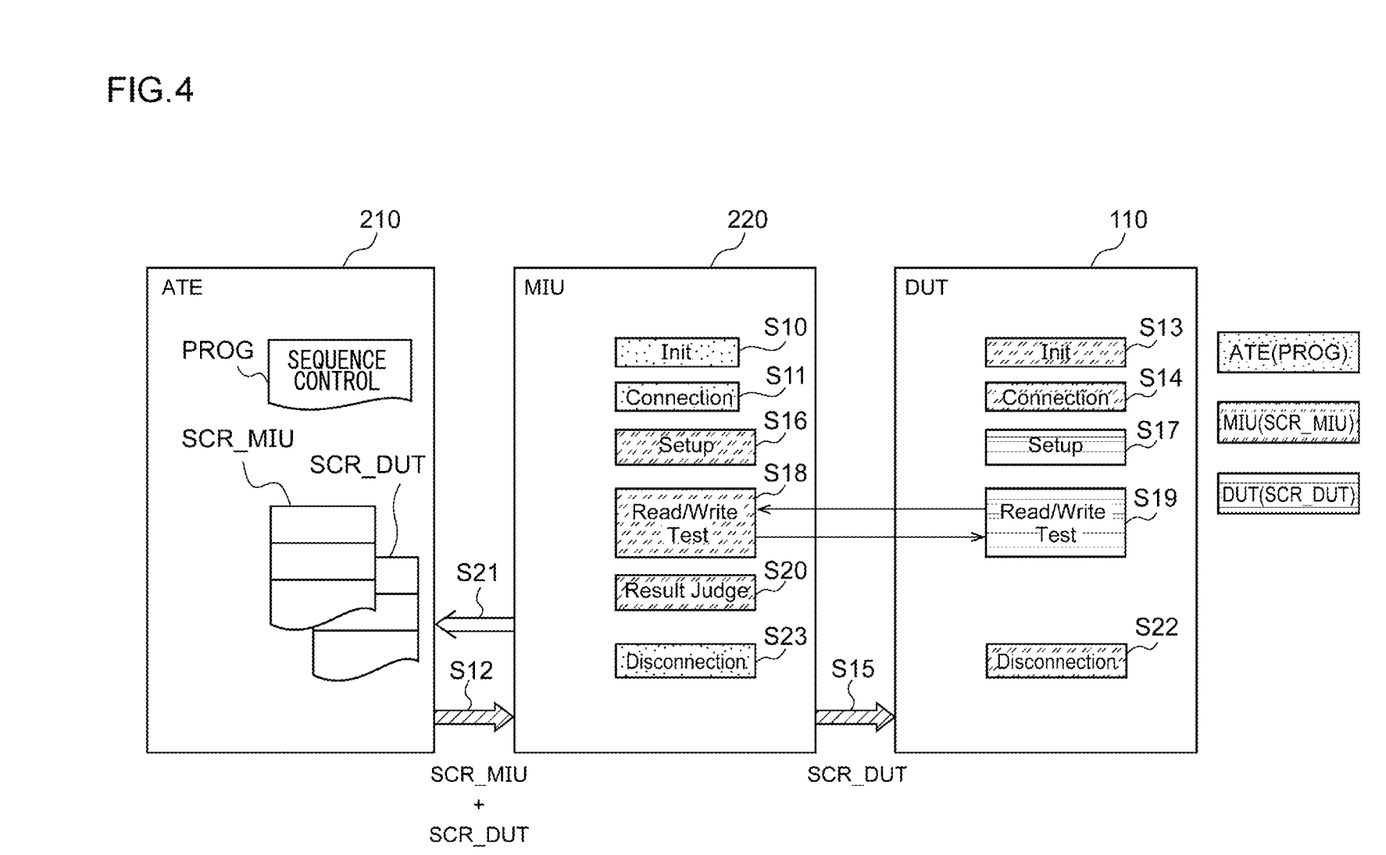
FIG. 4 is a diagram for explaining the execution of instructions for respective components in a function test.

Next, description will be made regarding the function test (connection test) supported by the device-side communication circuit 114. FIG. 4 is a diagram for explaining the execution of an instruction for each component in the function test.

In FIG. 4, the operation based on a main program FROG the operation based on the DUT script SCR_DUT, the operation based on the MIU script SCR_MIU are each shown with different kinds of hatching.

The main controller 210 stores a test program PROG which functions as a framework. Furthermore, in the initial state, the scripts SCR1 and SCR2 to be executed by the DUT 110 and the MIU 220 are stored in the main controller 210.

When a main processor (tester processor) starts to execute the test program PROG in the main controller 210, the MIU 220 is initialized (S10). After the initialization is completed, a link is established by the bus B1 between the main controller 210 and the MIU 220 (S11). Subsequently, the scripts SCR1 and the SCR2 are loaded to the MIU 220 via the bus B1 (S12).

The MIU 220 executes the MIU script SCR_MIU. The MIU 220 instructs the DUT 110 to initialize the DUT 110 itself based on the MIU script SCR_MIU (S13). This establishes a link between the MIU 220 and the DUT 110 via the bus B2 (S14). Subsequently, the DUT script SCR_DUT is loaded to the DUT 110 via the bus B2 (S15).

The MIU 220 executes processing based on the tester script SCR1. Furthermore, the MIU 220 supplies an instruction to the DUT 110 to start the DUT script SCR_DUT. The DUT 110 starts to execute processing based on the DUT script SCR_DUT using the instruction from the MIU 220 as a trigger.

The MIU 220 executes setup S16 of the tester-side communication circuit 224. The DUT 110 executes setup S17 of the device-side communication circuit 114.

Upon executing the DUT script SCR_DUT, the functioning of the device-side communication circuit 114 is tested (function test). In the function test, an instruction for controlling the device-side communication circuit 114 and an instruction for controlling the tester-side communication circuit 224 are executed. Data is transmitted and received between the MIU 220 and the DUT 110 via the transmission channel CH.

After the data transmission/reception is completed, the MIU 220 compares the data acquired in the final stage with its expected value based on the MIU script SCR_MIU, and judges the quality (S20). The quality judgment result thus obtained is transmitted to the main controller 210 (S21).

The link between the DUT 110 and the MIU 220 is disconnected by the control of the MIU 220 (S22). The link between the main controller 210 and the MIU 220 is disconnected by the control of the main controller 210 (S23).

It should be noted that, in FIG. 4, the number "#" in each reference symbol "S #" that indicates the corresponding processing is by no means intended to restrict the processing sequence.

Figure 5:
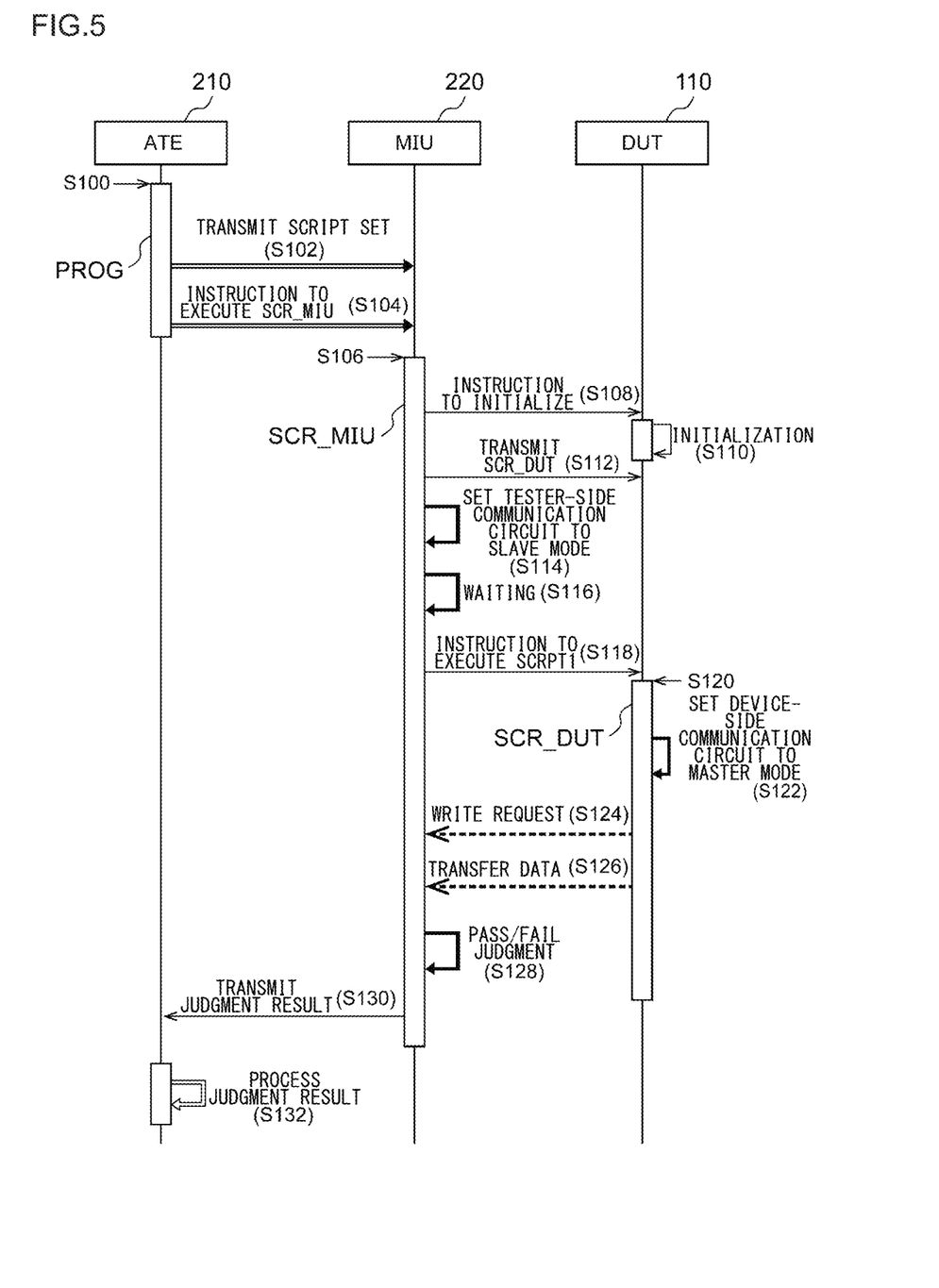
FIG. 5 is a sequence diagram with respect to the function test.

FIG. 5 is a sequence diagram with respect to the function test. In the sequence diagram, the processing to be executed by the main controller 210 based on the test program PROG is indicated by the double line. The processing to be executed by the MIU 220 based on the MIU script SCR_MIU is indicated by the heavy line. The processing to be executed by the DUT 110 based on the DUT script SCR_DUT is indicated by the broken line.

The main controller (ATE) 210 starts to execute the test program PROG (S100). The main controller 210 transmits a script set SCR0 to the MIU 220 (S102). The script set SCR0 is transmitted by means of the bus B1. The script set SCR0 includes the script SCR1 to be executed by the DUT 110 in addition to the script SCR2 to be executed by the MIU 220. Furthermore, the script set SCR0 includes the expected value data.

Subsequently, the main controller 210 supplies an instruction to the MIU 220 to execute the MIU script SCR_MIU (S104). In response to this, the tester-side processor 222 of the MIU 220 starts to execute the MIU script SCR_MIU (S106).

The tester-side processor 222 of the MIU 220 instructs the DUT 110 to initialize the DUT 110 itself according to the MIU script SCR_MIU (S108). In this stage, the DUT 110 is initialized (S1110). After this initialization, the MIU 220 and the DUT 110 are able to communicate via the bus B2.

Subsequently, the MIU 220 transmits the DUT script SCR_DUT to the DUT 110 according to the MIU script SCR_MIU (S112). The DUT script SCR_DUT is transmitted by means of the bus B2.

The tester-side processor 222 of the MIU 220 sets the tester-side communication circuit 224 to the slave mode (S114), and sets the tester-side communication circuit 224 to a standby state for waiting for a protocol signal defined by I$^2$C to be supplied from the DUT 110 (S116). It should be noted that a transmission clock signal and serial data are transmitted via I$^2$C. However, there is no relation between the clock signal and the system clock to be used in the DUT 110.

Subsequently, the MIU 220 instructs the device-side processor 112 of the DUT 110 to execute the device script SCRPT1 (S118). The device-side processor 112 of the DUT 110 starts to execute the DUT script SCR_DUT (S120). After this stage, the test is executed with the DUT 110 as the master.

The device-side processor 112 sets the device-side communication circuit 114 to the master mode based on the DUT script SCR_DUT (S122). Subsequently, the device-side communication circuit 114 transmits a write request (protocol signal) to the tester-side communication circuit 224 (S124). Subsequently, the device-side communication circuit 114 outputs serial data (S126). The serial data to be output in this step is determined beforehand.

After the writing is completed, the tester-side processor 222 compares the received data with its expected value according to the MIU script SCR_MIU (S128).

Subsequently, the judgement result is transmitted to the main controller 210 via the bus B1 (S130). Subsequently, the main controller 210 processes the judgment result (S132).

The above is the function test in a case in which the communication protocol is I$^2$C, the device-side communication circuit 114 is set to the master mode, and the tester-side communication circuit 224 is set to the slave mode.

Figure 6:
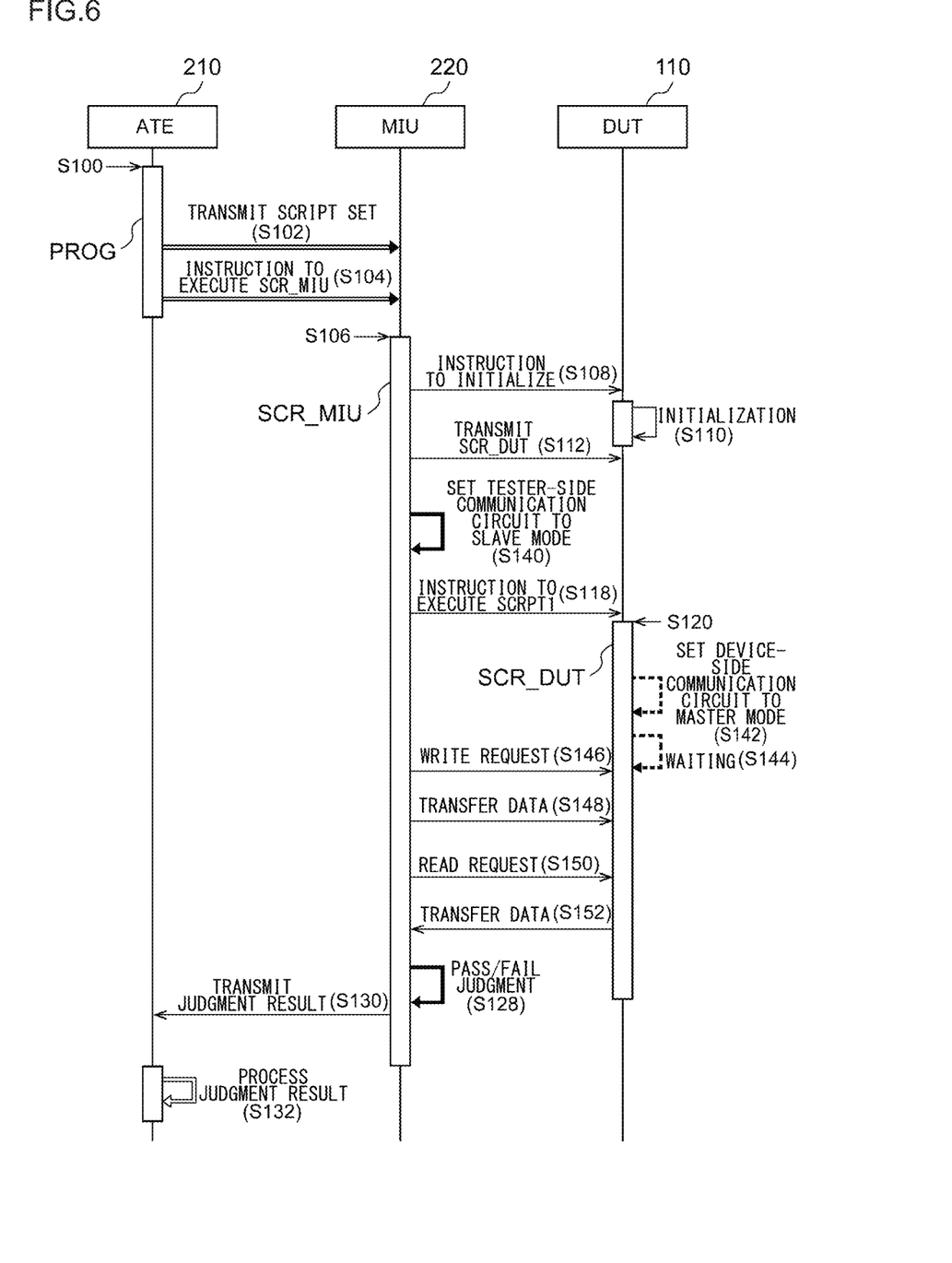
FIG. 6 is another sequence diagram with respect to the function test.

The function test can be executed in a state in which such a master/slave relation is switched. FIG. 6 is another sequence diagram with respect to the function test. FIG. 6 shows the function test in a case in which the device-side communication circuit 114 is set to the slave mode, and the tester-side communication circuit 224 is set to the master mode. It should be noted that the instructions included in the script SCR1 to be executed by the DUT 110 and the instructions included in the script SCR2 to be executed by the MIU 220 in this function test are different from those shown in FIG. 5.

The processing represented by S100 through S112 is the same as that shown in FIG. 5. After the DUT script SCR_DUT is transmitted to the DUT 110 (S112), the tester-side processor 222 sets the tester-side communication circuit 224 to the master mode (S140). Subsequently, the tester-side processor 222 instructs the DUT 110 to execute the DUT script SCR_DUT (S118). Upon receiving this instruction, the device-side processor 112 starts to execute the DUT script SCR_DUT (S120).

The device-side processor 112 sets the device-side communication circuit 114 to the slave mode according to the DUT script SCR_DUT (S142). The device-side communication circuit 114 waits for a protocol signal (read instruction or write instruction) from the tester-side communication circuit 224 (S144).

Subsequently, the tester-side communication circuit 224 outputs a write request to the device-side communication circuit 114 (S146). Subsequently, the data is transferred (S148).

Subsequently, the tester-side communication circuit 224 outputs a read request to the device-side communication circuit 114 (S150). Subsequently, the tester-side communication circuit 224 reads data from the device-side communication circuit 114, and the data thus read is transferred (S152). Subsequently, the tester-side processor 222 compares the data thus read with its expected value (S128).

The above is the configuration and the operation of the test system 100 according to the embodiment.

In a case in which the ATE is employed as the main controller 210, this arrangement is capable of supporting a test system that is capable of switching its control mode between (i) an asynchronous control mode in which the composite device (DUT) functions as the master, and (ii) a control mode in which the ATE functions as the master.

In the asynchronous control mode in which the DUT 110 is set to the master, the control between the main controller 210 and the MIU 220 may be executed as asynchronous control or synchronous control. In a case in which high measurement efficiency is desired in a multi-die test, the control is preferably executed as asynchronous control. In a case in which the test is to be executed using resources specific to an ATE, the control is preferably executed as synchronous control.

As described above, the function test for the communication circuit may be executed in an asynchronous control mode. In addition, an application layer test and a system cost verification may be executed in an asynchronous control mode.

A parameter test, which is a function specific to an ATE, may be executed in the synchronous control mode in which the ATE is set to the master. In addition, a physical layer test, stress test, multi-die test, and test-time test may each be executed in the synchronous control mode.

Description has been made regarding the present invention with reference to the embodiments. However, the above-described embodiments show only the mechanisms and applications of the present invention for exemplary purposes only, and are by no means intended to be interpreted restrictively. Rather, various modifications and various changes in the layout can be made without departing from the spirit and scope of the present invention defined in appended claims.

MODIFICATION 1

Description has been made in the present embodiment regarding an arrangement including a single device-side communication circuit 114. Also, the DUT 110 may include multiple device-side communication circuits 114 having different protocols. For example, the DUT 110 may include communication circuits that support four protocols, i.e., $I^2C$, HDMI, WiFi, and Bluetooth. In this case, the MIU 220 mounts multiple tester-side communication circuits 224 that conform to the multiple protocols supported by the DUT 110.

MODIFICATION 2

Instead of the ATE, the main controller 210 may be configured as a general-purpose computer or workstation.

While the preferred embodiments of the present invention have been described using specific terms, such description is for illustrative purposes only, and it is to be understood that changes and variations may be made without departing from the spirit or scope of the appended claims.

What is claimed is:

1. A test apparatus structured to test a device under test comprising a device-side communication circuit and a program-controllable device-side processor, wherein the device-side communication circuit and the device-side processor are embedded in the device under test, and wherein the device under test is autonomously operable while the device-side processor executes a program, the test apparatus comprising:
   a main controller structured to integrally control the test apparatus; and
   an interface unit comprising a program-controllable tester-side processor and a tester-side communication circuit structured to form a transmission channel between the interface unit and the device-side communication circuit;
   wherein the device-side processor executes a device script so as to execute a function test with the device under test as a master in an asynchronous manner, and a functioning of the device-side communication circuit is tested in the function test.

2. The test apparatus according to claim 1, wherein the device script can be loaded to the device under test from the test apparatus before a test.

3. The test apparatus according to claim 2, wherein the device script is loaded via a wired interface that differs from the interface unit between the device-side communication circuit and the tester-side communication circuit.

4. The test apparatus according to claim 1, wherein the device-side communication circuit and the tester-side communication circuit each conforms to $I^2C$ (Inter IC) or SPI (Serial Peripheral Interface),
   and wherein a master/slave relation can be switched between the device-side communication and the tester-side communication circuit.

5. The test apparatus according to claim 1, wherein the interface unit judges a quality of the device under test based on data received by the tester-side communication circuit via the transmission channel,
   and wherein a judgment result is provided to the main controller.

6. The test apparatus according to claim 1, wherein the tester-side processor executes a tester script that defines a test sequence together with the device script.

7. A test apparatus structured to test a device under test, wherein the device under test has a device-side communication circuit and a device-side processor embedded in the device under test, and wherein the device under test is autonomously operable while the device-side processor executes a program, and the device under test does not support external synchronous control, the test apparatus comprising:

a main controller structured based on an architecture that is capable of testing another device under test which supports external synchronous control by synchronous control with the main controller as a master; and an interface unit structured as an interface between the main controller and the device under test, and structured to establish asynchronous control between the interface unit and the device under test with the device under test as a master, and to establish control between the interface unit and the main controller with the main controller as a master, and the test apparatus executes a function test in which a functioning of the device-side communication circuit is tested.

8. An interface unit to be employed in a test apparatus structured to test a device under test, wherein the device under test has a device-side communication circuit and a device-side processor embedded in the device under test, and wherein the device under test is autonomously operable while the device-side processor executes a program, and the device under test does not support external synchronous control, wherein the test apparatus is used together with a main controller structured based on an architecture that is capable of testing another device under test which supports external synchronous control by synchronous control with the test apparatus as a master, and wherein the interface unit is structured as an interface between the main controller and the device under test, and structured to establish asynchronous control between the interface unit and the device under test with the device under test as a master, and to establish control between the interface unit and the main controller with the main controller as a master, and the test apparatus executes a function test in which a functioning of the device-side communication circuit is tested.

9. A test method for testing a device under test comprising a device-side communication circuit and a program-controllable device-side processor wherein the device-side communication circuit and the device-side processor are embedded in the device under test, and wherein the device under test is autonomously operable while the device-side processor executes a program, the test method comprising:

loading a device script to the device under test;

executing the device script by the device-side processor in the device under test so as to execute a function test with the device under test as a master in an asynchronous manner, and a functioning of the device-side communication circuit is tested in the function test;

transmitting, by the device-side communication circuit, data generated based on the device script to a test apparatus; and judging, by the test apparatus, a quality of the device under test based on the data.

* * * * *